United States Patent
Lin

(10) Patent No.: US 8,730,078 B2
(45) Date of Patent: May 20, 2014

(54) SIGNAL SENSING CIRCUIT

(71) Applicant: Egalax_Empia Technology Inc., Taipei (TW)

(72) Inventor: Po-Chuan Lin, Taipei (TW)

(73) Assignee: Egalax_Empia Technology Inc., Taipei (TW)

( * ) Notice: Subject to any disclaimer, the term of this patent is extended or adjusted under 35 U.S.C. 154(b) by 0 days.

(21) Appl. No.: 13/792,786

(22) Filed: Mar. 11, 2013

(65) Prior Publication Data

US 2013/0234875 A1    Sep. 12, 2013

Related U.S. Application Data

(60) Provisional application No. 61/609,466, filed on Mar. 12, 2012.

(51) Int. Cl.
*H03M 1/34*    (2006.01)

(52) U.S. Cl.
CPC ........................................ *H03M 1/34* (2013.01)
USPC .......................................... 341/158; 341/155

(58) Field of Classification Search
CPC ............................. H03M 1/34; H03M 19/0005
USPC .................................... 341/155, 135, 143, 158
See application file for complete search history.

(56) References Cited

U.S. PATENT DOCUMENTS

| 4,851,846 | A | * | 7/1989 | Haulin | 341/172 |
| 5,191,445 | A | * | 3/1993 | Kurokawa et al. | 358/461 |
| 5,579,006 | A | * | 11/1996 | Hasegawa et al. | 341/162 |

* cited by examiner

*Primary Examiner* — Peguy Jean Pierre
(74) *Attorney, Agent, or Firm* — WPAT, PC; Justin King

(57) ABSTRACT

A signal sensing circuit converts a received current input into a voltage output and provides the voltage output to an analog-to-digital converter (ADC) to generate a digital output signal. The voltage output is associated with a circuit having a first reference impedance, and a reference voltage of the ADC is associated with a circuit having a second reference impedance, wherein the circuit having the first reference impedance and the circuit having the second reference impedance are formed by the same material, so that the ratio between the changes in the current input and the changes in the value of the digital output signal is a constant.

9 Claims, 3 Drawing Sheets

SIGNAL SENSING CIRCUIT

CROSS REFERENCE TO RELATED PATENT APPLICATION

This patent application claims the domestic priority of the U.S. provisional application 61/609,466 filed on Mar. 12, 2012, and hereby incorporated by reference.

BACKGROUND OF THE INVENTION

1. Field of the Invention

The present invention relates to a signal sensing circuit, and more particularly, to a signal sensing circuit inside an integrated circuit.

2. Description of the Prior Art

Referring to FIG. 1, an inverting closed-loop amplifier for measuring current is shown. This inverting closed-loop amplifier includes a negative feedback loop, wherein the negative feedback loop has a reference resistor with a reference impedance R. When the negative input of the inverting closed-loop amplifier receives a current input I, the ratio between changes in a voltage output V of the inverting closed-loop amplifier and changes in the current input I is a constant. For example, the potential to which the positive input of the negative feedback loop is coupled is 0, the output voltage V equals to the input current I multiplied by the reference resistor R. Thus, when current is converted into voltage, there will be an effect of the impedance R, that is, the conversion is dependent on the impedance.

If this circuit is implemented in a semiconductor manufacturing process for an integrated circuit, manufacturing process variations may create variations in the impedance. In the same integrated circuit, the characteristic variations of the impedances may be similar, whereas the characteristic variations of the impedances between different integrated circuits may have large differences, possibly up to ±20%.

From the above it is clear that prior art still has shortcomings. In order to solve these problems, efforts have long been made in vain, while ordinary products and methods offering no appropriate structures and methods. Thus, there is a need in the industry for a novel technique that solves these problems.

SUMMARY OF THE INVENTION

Impedances in integrated circuits may vary with manufacturing process variations up to ±20%, such that the same signal in different integrates circuits will create different results due to the process variations. The present invention proposes a signal sensing circuit that converts a received current input into a voltage output and provides the voltage output to an analog-to-digital converter (ADC) to generate a digital output signal. The voltage output is associated with a circuit having a first reference impedance, and a reference voltage of the ADC is associated with a circuit having a second reference impedance, wherein the circuit having the first reference impedance and the circuit having the second reference impedance are formed by the same material, so that the ratio between the changes in the current input and the changes in the value of the digital output signal is a constant.

The above and other objectives of the present invention can be achieved by the following technical scheme. A signal sensing circuit proposed by the present invention may include: an analog front-end current sensing circuit for outputting a voltage output based on a current input, the voltage output being associated with a circuit having a first reference impedance; a current source for providing a reference current; a reference voltage generating circuit for generating a high reference voltage and a low reference voltage based on the reference current, wherein the voltage difference between the high and the low reference voltages is associated with a circuit having a second reference impedance, and the circuit having the first reference impedance and the circuit having the second reference impedance are formed by the same material; and an analog-to-digital converter (ADC) for converting the voltage output into a digital output signal based on the reference voltages, where the value of the digital output signal varies with the changes in the current input, and the ratio between the changes in the current input and the changes in the value of the digital output signal is a constant, such that the digital output signal generated based on the current input will not vary with characteristic variations of the material due to temperature and/or moisture.

With the above technical scheme, the present invention achieves at least the following advantage and beneficial effect: the ratio between the changes in the current input and the changes in the value of the digital output signal is a constant, such that the digital output signal generated based on the current input will not vary with the variations in characteristics of said material due to temperature and/or moisture.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
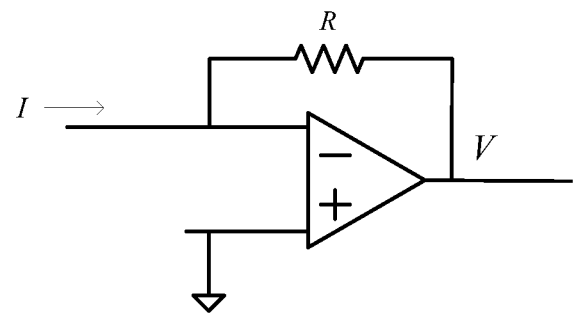
FIG. 1 is a schematic diagram illustrating a current sensing circuit in the prior art.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Figure 2:
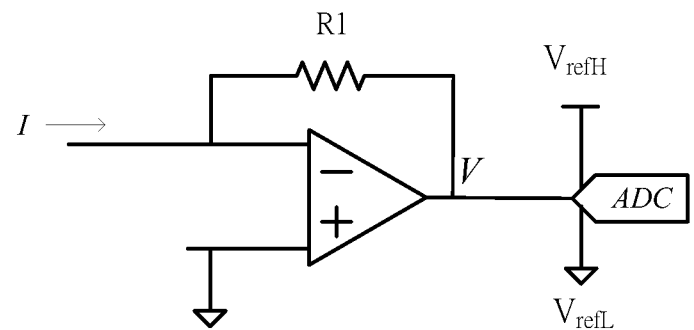
FIG. 2 is a schematic diagram illustrating an analog-to-digital converter (ADC) for reading a current signal in the prior art.

Referring to FIG. 2, when measuring the current input I, the voltage output V can be received and converted into a digital output signal by an A/D converter (ADC). The ADC converts the voltage output into the digital output signal based on a high reference potential $V_{refH}$ and a low reference potential $V_{refL}$. Thus, the value of the digital output signal will be $2^n \times ((V-V_{refL})/(V_{refH}-V_{refL}))$, wherein n is the number of bits of the digital output signal.

If the high reference potential $V_{refH}$ and the low reference potential $V_{refL}$ are a working potential VDD and the ground potential GND, respectively, then the digital output signal will be $2^n \times I \times R1/V_{DD}$, which is dependent on a first reference impedance R1. Thus, when the first reference impedance R1 varies with temperature and/or moisture, the same current input I will create different values of the digital output signal. Also, in different integrated circuits, the first reference impedance R1 may varies even under the same temperature and/or moisture, and similarly, the same current input I will create different values of the digital output signal.

In an example of the present invention, the high reference potential $V_{refH}$ and the low reference potential $V_{refL}$ are also associated with a second reference impedance R2, and the difference in potentials of the high reference potential $V_{refH}$ and the low reference potential $V_{refL}$ is $I_{ref} \times R2$, wherein $I_{ref}$ is a fixed current. The value of the digital output signal is $2^n \times (I \times R1 - V_{refL})/(Iref \times R2)$, that is, directly proportional to $(I \times R1 - V_{refL})/(Iref \times R2)$.

If the second reference impedance R2 and the first reference impedance R1 are on the same integrated circuit, the process variations will be close to each other. Thus, the ratio between the first reference impedance R1 and the second reference impedance R2 can be regarded as a constant C, such that the digital output signal generated based on the current input will not vary with the characteristic variations of the material due to temperature and/or moisture.

If the high reference potential $V_{refH}$ and the low reference potential $V_{refL}$ are $I_{ref} \times R2$ and 0 (ground potential GND), respectively, then the digital output signal is $2^n \times (I \times R1)/(I_{ref} \times R2) = 2^n \times I \times C/I_{ref}$, such that the digital output signal generated based on the current input will not vary with the characteristic variations of the material due to temperature and/or moisture.

The present invention may further include an operational circuit for calculating the difference between digital output signals obtained at a first time instance and a second time instance to generate a digital difference value which does not dependent or has low dependency on the process variations of the first reference impedance R1 and the second reference impedance R2. For example, the current signals at the first and the second time instances are I1 and I2, respectively, and the digital difference value is $((I2-I1) \times R1)/(I_{ref} \times R2)$, wherein the ratio between the first reference impedance R1 and the second reference impedance R2 is the constant C, so the digital difference value becomes $((I2-I1) \times C)/I_{ref}$. As a result, the digital output signal generated based on the current input will not vary with the characteristic variations of the material due to temperature and/or moisture.

Since the digital output signals obtained at the first and the second time instances are $2^n \times (I1 \times R1 - V_{refL})/(Iref \times R2)$ and $2^n \times (I2 \times R1 - V_{refL})/(Iref \times R2)$, respectively, when they are subtracted from each other, they will cancel each other out, so the digital difference value is not or poorly dependent on $V_{refL}$. Accordingly, in another example of the present invention, the high reference potential $V_{refH}$ and the low reference potential $V_{refL}$ are $V_{cm}+I_{ref} \times R2/2$ and $V_{cm}-I_{ref} \times R2/2$, respectively, such that the digital output signal generated based on the current input will not vary with the characteristic variations of the material due to temperature and/or moisture.

Figure 3:
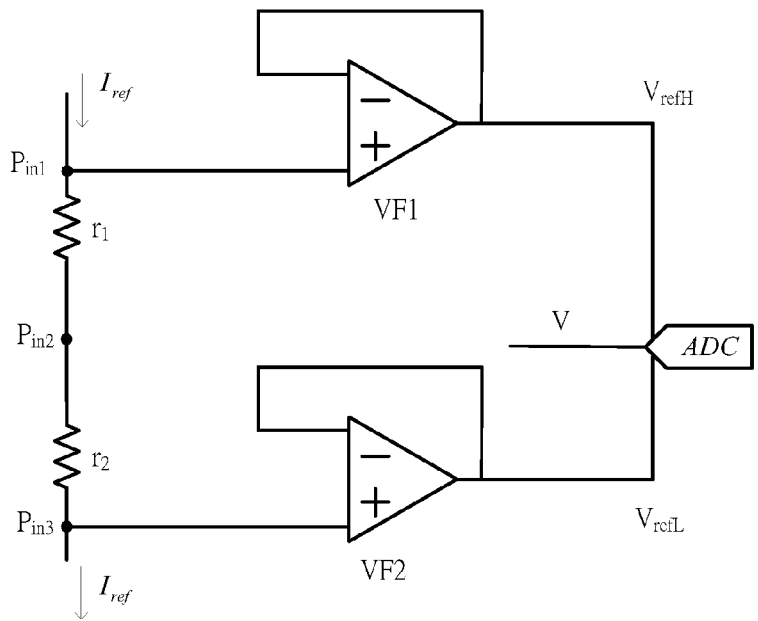
FIGS. 3 and 4 are schematic diagrams illustrating signal sensing circuits inside integrated circuits in accordance with the present invention.

Referring now to FIG. 3, a schematic diagram illustrating a reference voltage generating circuit of the present invention is shown. It is used for generating said high reference potential $V_{refH}$ and said low reference potential $V_{refL}$. A first junction $P_{in1}$ is coupled to a first voltage follower VF1 and a first resistor $r_1$. The first voltage follower VF1 receives a reference current $I_{ref}$ from the first junction $P_{in1}$ and outputs the high reference potential $V_{refH}$. The first resistor $r_1$ receives the reference current $I_{ref}$ from the first junction $P_{in1}$, and the impedance is R2/2. In addition, a second junction $P_{in2}$ receives the reference current $I_{ref}$ from the first resistor $r_1$ and provides it to a second resistor $r_2$, and a third junction $P_{in3}$ receives the reference current $I_{ref}$ from the second resistor $r_2$, wherein the impedance of the second resistor $r_2$ is R2/2. A second voltage follower VF2 receives the reference current $I_{ref}$ from the third junction $P_{in3}$ and outputs the low reference potential $V_{refL}$. In an example of the present invention, the high reference potential=the second reference impedance×the reference current, and the low reference potential=0.

Figure 4:
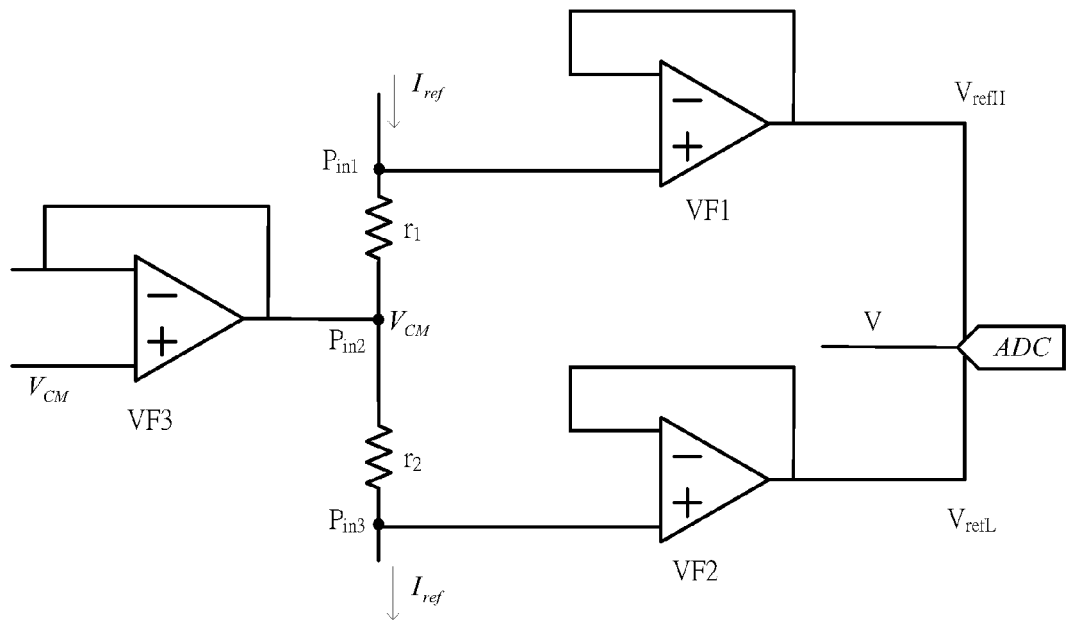
Figure 5:
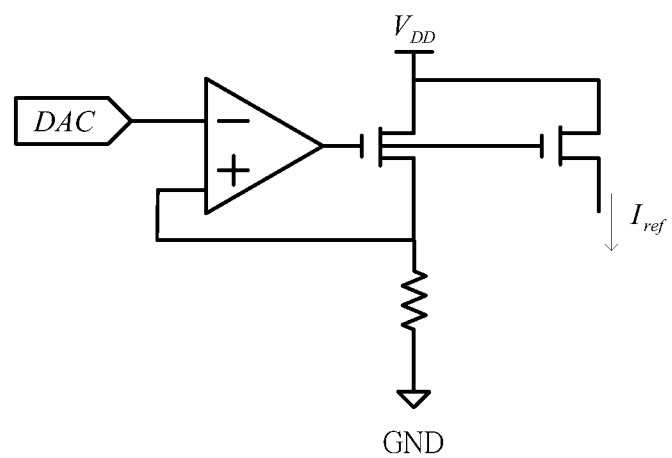
FIG. 5 is a schematic diagram illustrating a current source.

Referring to FIG. 4, a schematic diagram illustrating another reference voltage generating circuit of the present invention is shown. Compared to FIG. 3, the circuit further includes a third voltage follower VF3 for providing an input potential $V_{cm}$ to the third junction. In another example of the present invention, the high reference potential=the input potential+½×the second reference impedance×the reference current, and the low reference potential=the input potential−½×the second reference impedance×the reference current. Moreover, the current source can be as shown in FIG. 5, but one with ordinary skill in the art can appreciate other implementations of the current source, and they will not be further described herein.

In summary, in a best mode of the present invention, a signal sensing circuit includes an analog front-end current sensing circuit, a current source, a reference voltage generating circuit and an analog-to-digital converter (ADC).

The analog front-end current sensing circuit outputs a voltage output based on a current input. The voltage output is associated with a circuit having a first reference impedance. The ratio between the changes in the voltage output and the changes in the current input is a constant. For example, the circuit with the first reference impedance is the first reference resistor shown in FIG. 1.

The current source provides a reference current. In an example of the present invention, as shown in FIG. 5, for example, a precise reference current is produced based on a digital input signal. The digital input signal is provided to the current source after being converted to a digital signal by a digital-to-analog converter (DAC), so as to generate the reference current $I_{ref}$.

The reference voltage generating circuit generates a high reference voltage and a low reference voltage based on the reference current, wherein the voltage difference between the high and the low reference voltages is associated with a circuit having a second reference impedance, and the circuit having the first reference impedance and the circuit having the second reference impedance are formed by the same material. As shown in FIGS. 3 and 4, the circuit having the second reference impedance includes the first resistor r1 and the second resistor r2. In an example of the present invention, the voltage difference between the high and the low reference voltages=the reference current×the second reference impedance.

The ADC converts the voltage output into a digital output signal based on the reference voltages, where the value of the digital output signal varies with the changes in the current input, and the ratio between the changes in the current input and the changes in the value of the digital output signal is a constant, such that the digital output signal generated based on the current input will not vary with the characteristic variations of the material due to temperature and/or moisture. In an example of the present invention, the value of the digital output signal is $2^n \times$(the voltage output−the low reference voltage)/the voltage difference between the high reference voltage and the low reference voltage, wherein n is the number of bits in the digital output signal.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A signal sensing circuit comprising:
   an analog front-end current sensing circuit for outputting a voltage output based on a current input, the voltage output being associated with a circuit having a first reference impedance;
   a current source for providing a reference current;
   a reference voltage generating circuit for generating a high reference voltage and a low reference voltage based on the reference current, wherein the voltage difference between the high and the low reference voltages is associated with a circuit having a second reference impedance, and the circuit having the first reference impedance and the circuit having the second reference impedance are formed by the same material; and
   an analog-to-digital converter (ADC) for converting the voltage output into a digital output signal based on the reference voltages, where the value of the digital output signal varies with the changes in the current input, and the ratio between the changes in the current input and the changes in the value of the digital output signal is a constant, such that the digital output signal generated based on the current input will not vary with characteristic variations of the material due to temperature and/or moisture.

2. The signal sensing circuit of claim 1, wherein the ratio between the changes in the voltage output and the changes in the current input is a constant.

3. The signal sensing circuit of claim 1, wherein the voltage difference between the high reference voltage and the low reference voltage=the reference current×the second reference impedance.

4. The signal sensing circuit of claim 1, wherein the reference voltage generating circuit includes:
   a first junction;
   a first voltage follower for receiving the reference current from the first junction and outputting the high reference voltage;
   a first resistor for receiving the reference current from the first junction, and having an impedance that is ½ of the second reference impedance;
   a second junction for receiving the reference current from the first resistor;
   a second resistor for receiving the reference current from the second junction and having an impedance that is ½ of the second reference impedance;
   a third junction for receiving the reference current from the second resistor; and
   a second voltage follower for receiving the reference current from the third junction and outputting the low reference voltage.

5. The signal sensing circuit of claim 4, wherein the reference voltage generating circuit further includes:
   a third voltage follower for providing an input potential to the third junction,
   wherein the high reference voltage=the input potential+½×the second reference impedance×the reference current, and the low reference voltage=the input potential−½×the second reference impedance×the reference current.

6. The signal sensing circuit of claim 4, wherein the high reference voltage=the second reference impedance×the reference current, and the low reference voltage=0.

7. The signal sensing circuit of claim 4, wherein the high reference voltage=an input potential+½×the second reference impedance×the reference current, and the low reference voltage=the input potential−½×the second reference impedance×the reference current.

8. The signal sensing circuit of claim 4, wherein the value of the digital output signal is $2^n \times$(the voltage output−the low reference voltage)/the voltage difference between the high reference voltage and the low reference voltage, wherein n is the number of bits in the digital output signal.

9. The signal sensing circuit of claim 4, wherein the current source generates the reference current based on a digital input signal.

* * * * *